United States Patent
Bando et al.

(10) Patent No.: US 6,700,792 B1
(45) Date of Patent: Mar. 2, 2004

(54) HIGH-FREQUENCY COMPOSITE COMPONENT AND PORTABLE WIRELESS DEVICE INCORPORATING THE COMPONENT

(75) Inventors: Tomoya Bando, Omihachiman (JP); Ken Tonegawa, Otsu (JP); Norihiro Shimada, Shiga-ken (JP); Yoshihiro Yoshimoto, Shiga-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/505,258

(22) Filed: Feb. 16, 2000

(30) Foreign Application Priority Data

Feb. 16, 1999 (JP) ............................. 11-037547
Jun. 15, 1999 (JP) ............................. 11-168843

(51) Int. Cl.[7] .................................... H05K 1/03
(52) U.S. Cl. ................. 361/761; 330/303; 330/307; 333/185; 333/247; 333/134; 333/136; 333/101; 257/737; 257/738; 257/728; 439/101; 455/118; 455/313; 455/314
(58) Field of Search ................. 330/303, 307; 333/185, 247, 134, 101; 257/275, 664; 455/118, 313, 314; 361/782, 794, 761

(56) References Cited

U.S. PATENT DOCUMENTS

| | | | | |
|---|---|---|---|---|
| 4,739,448 A | * | 4/1988 | Rowe et al. ............... 333/238 |
| 5,387,888 A | * | 2/1995 | Eda et al. ................. 257/664 |
| 5,459,368 A | * | 10/1995 | Onishi et al. ............ 310/313 R |
| 5,656,874 A | * | 8/1997 | Kato et al. ................ 307/111 |
| 5,705,960 A | * | 1/1998 | Izumiyama ............... 333/246 |
| 5,719,750 A | * | 2/1998 | Iwane ...................... 361/794 |
| 5,783,976 A | * | 7/1998 | Furutani et al. .......... 327/552 |
| 5,796,165 A | * | 8/1998 | Yoshikawa et al. ...... 257/698 |
| 5,999,065 A | * | 12/1999 | Furutani et al. .......... 333/103 |
| 6,040,524 A | * | 3/2000 | Kobayashi et al. ...... 144/134.1 |
| 6,100,776 A | * | 8/2000 | Furutani et al. .......... 333/134 |
| 6,143,990 A | * | 11/2000 | Kuramochi et al. ...... 174/260 |
| 6,252,778 B1 | * | 6/2001 | Tonegawa et al. ....... 257/737 |

FOREIGN PATENT DOCUMENTS

| | | |
|---|---|---|
| JP | 7-131159 | 5/1995 |
| JP | 8-288739 | 11/1996 |

* cited by examiner

Primary Examiner—Nay Maung
Assistant Examiner—Sujatha Sharma
(74) Attorney, Agent, or Firm—Keating & Bennett, LLP

(57) ABSTRACT

A high-frequency composite component can achieve reduction in size and weight, while providing high performance. A portable wireless device incorporates the high-frequency composite component, including a multi-layer substrate, with a low noise amplifier LNA and a band pass filter BPF constituting parts of a high-frequency circuit, with an input terminal, an output terminal, and control terminals on the substrate. The low noise amplifier LNA is constituted of transistors, an inductor, capacitors, and resistors. The band pass filter BPF is constituted of strip lines, an inductor, and capacitors. The low noise amplifier LNA and the band pass filter BPF are connected with each other within the substrate via a matching capacitor. The amplifier ground and filter ground are separated within the substrate and connected respectively to separate ground terminals on the substrate. In another embodiment, the high-frequency composite component may include a mixer and a high-pass filter integrated with a multi-layer substrate.

7 Claims, 9 Drawing Sheets

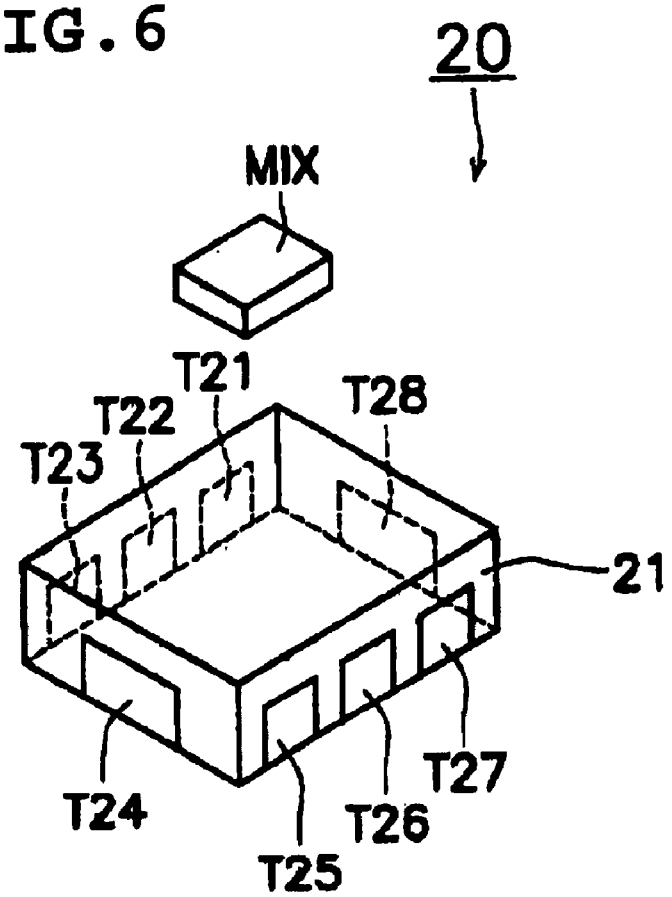

HIGH-FREQUENCY COMPOSITE COMPONENT AND PORTABLE WIRELESS DEVICE INCORPORATING THE COMPONENT

BACKGROUND OF THE INVENTION

1. Field of the Invention

The present invention relates to a high-frequency composite component for use in a high-frequency circuit performing transmission and reception of radio waves in a cellular phone, a pager, or the like, and a portable wireless device incorporating the component.

2. Description of the Related Art

A high-frequency composite component which can satisfy the needs for miniaturization, high performance, and price reduction, is needed for a high-frequency circuit in a portable wireless device such as a cellular phone of the Personal Handy-phone System (PHS) and the Personal Digital Cellular System (PDC). Such a high-frequency composite component is disclosed in Japanese Unexamined Patent Publication No. 7-58586.

FIG. 11 is the top view of the prior art high-frequency composite component. A high-frequency composite component 50 includes a low noise amplifier 52 for amplifying weak radio waves received by an antenna 51, a high-frequency filter 53 for eliminating unnecessary frequency components, and a substrate 54 for mounting these components. The low noise amplifier 52 is constituted of a field effect transistor Q51, capacitors C51 to C53, an inductor L51, and a resistor R51. The high-frequency filter 53 is constituted of surface acoustic wave resonators S51 and S52, and a capacitor C54.

In the prior art high-frequency composite component, however, since the low noise amplifier and the high-frequency filter are mounted on the substrate, a problem is that further reduction in size and weight is difficult.

SUMMARY OF THE INVENTION

To overcome the above described problems, embodiments of the present invention provide a high-frequency composite component in which reduction in size and weight and high performance can be achieved, and a portable wireless device incorporating the component.

To this end, according to one aspect of the present invention, there is provided a high-frequency composite component including a high-frequency circuit having an amplifier and a filter, a multi-layer substrate made by laminating a plurality of dielectric layers to integrate the amplifier and the filter with the multi-layer substrate, an amplifier ground, a filter ground, and external terminals formed on the multi-layer substrate. The amplifier ground and the filter ground are separate and are respectively connected to separate external terminals formed on the multi-layer substrate.

In addition, in the above high-frequency composite component, the amplifier may be disposed at the upper part of the multi-layer substrate and the filter may be disposed at the lower part of the multi-layer substrate.

Furthermore, in the high-frequency composite component, an active element and a passive element constituting the amplifier may be mounted on the multi-layer substrate as chip components, and a passive element constituting the filter may be built in the multi-layer substrate as a strip-line electrode or a capacitor electrode.

According to another aspect of the present invention, there is provided a high-frequency composite component including a high-frequency circuit having a mixer and a filter, a multi-layer substrate made by laminating a plurality of dielectric layers to integrate the mixer and the filter with the multi-layer substrate, a mixer ground, a filter ground, and external terminals formed on the multi-layer substrate. The mixer ground and the filter ground are separate and are respectively connected to separate external terminals formed on the multi-layer substrate.

In this high-frequency composite component, an active element and a passive element constituting the mixer may be mounted on the multi-layer substrate, and a passive element constituting the filter may be built in the multi-layer substrate as a strip-line electrode or a capacitor electrode.

According to another aspect of the present invention, a portable wireless device of the invention includes one of the above-described high-frequency composite components.

In the high-frequency composite component of the present invention, the amplifier ground and the filter ground constituting the high-frequency circuit integrated with the multi-layer substrate are separate and are connected to separate external terminals formed on the multi-layer substrate. As a result, the potential of the amplifier ground and the potential of the filter ground can be different.

Additionally, since the mixer ground and the filter ground constituting the high-frequency circuit integrated with the multi-layer substrate are separate and are connected to separate external terminals formed on the multi-layer substrate, leakage of high-frequency signals between the mixer and the filter can be suppressed.

Moreover, since the portable wireless device of the present invention adopts the high-frequency composite component in which oscillation can be suppressed or isolation can be provided, deterioration in the characteristics of the portable wireless device can be prevented.

Other features and advantages of the invention will be understood from the following detailed description of embodiments of the invention with reference to the drawings, in which like references indicate like elements and parts.

BRIEF DESCRIPTION OF THE DRAWINGS

FIG. 6 is a perspective view of the high-frequency composite component shown in FIG. 5;

DESCRIPTION OF EMBODIMENTS OF THE INVENTION

Figure 1:
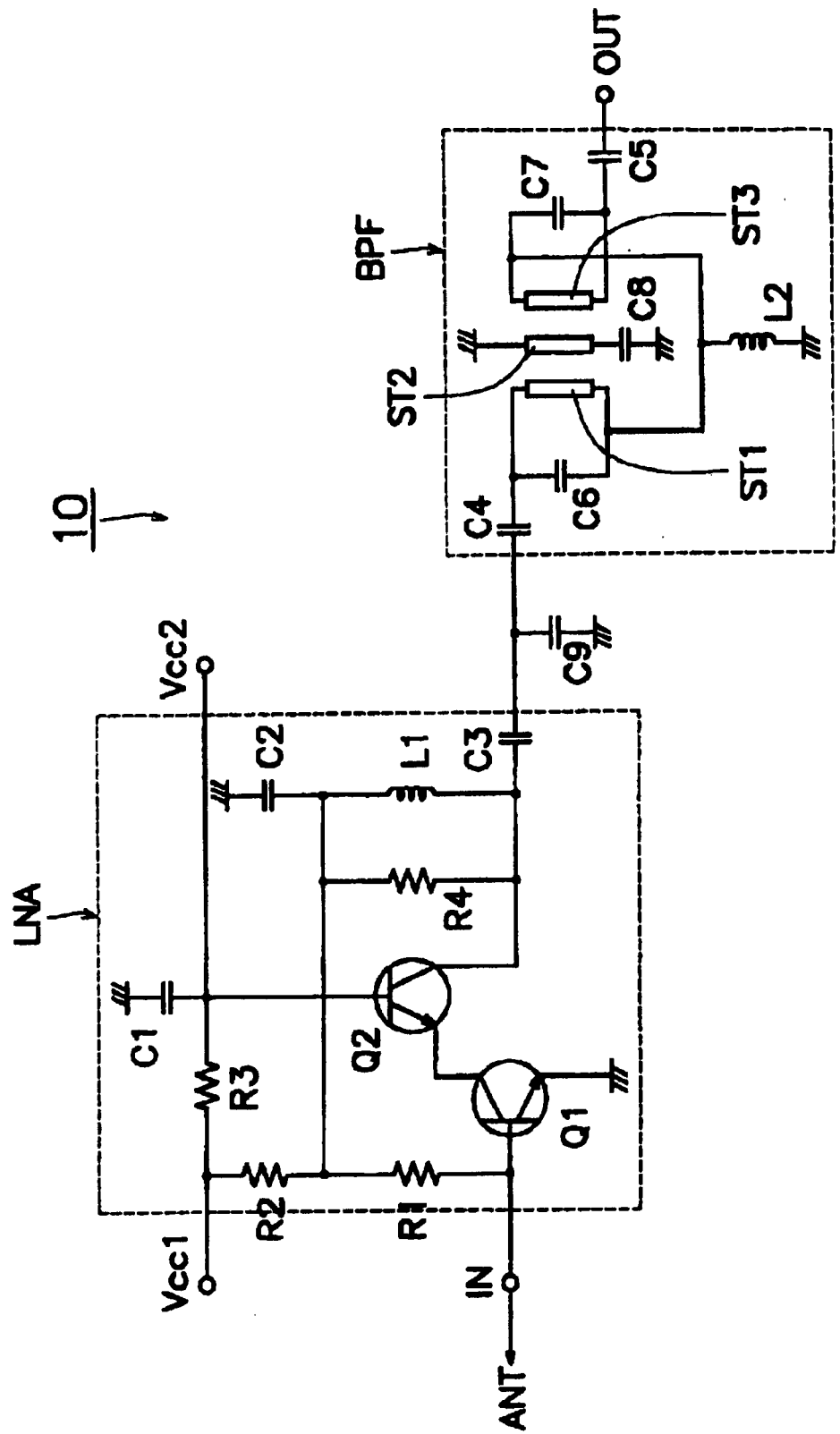
FIG. 1 is an equivalent circuit diagram of a high-frequency composite component in accordance with a first embodiment of the present invention.

A description will be given below of embodiments of the present invention referring to the drawings.

FIG. 1 shows a schematic circuit diagram of a high-frequency composite component in accordance with a first embodiment of the present invention. A high-frequency composite component 10 is constituted of a low noise amplifier LNA, which is an amplifier forming a part of the high-frequency circuit of a cellular phone or a pager of the PHS system or the PDC system, for example, and a band pass filter BPF which serves as a filter in the cellular phone or pager. Connected to these units, are an input terminal IN, an output terminal OUT, and control terminals Vcc1 and Vcc2, to form the high-frequency composite component.

In the low noise amplifier LNA, which is constituted of transistors Q1 and Q2, an inductor L1, capacitors C1 to C3, and resistors R1 to R4, signals received by an antenna ANT and input from the input terminal IN are amplified and are transmitted to the band pass filter BPF.

The band pass filter BPF, which is constituted of strip lines ST1 to ST3, an inductor L2, and capacitors C4 to C8, is used for eliminating unnecessary signals included in the received signals, which are amplified by the low noise amplifier LNA.

The low noise amplifier LNA and the band pass filter BPF are connected with each other via a matching capacitor C9.

Figure 2:
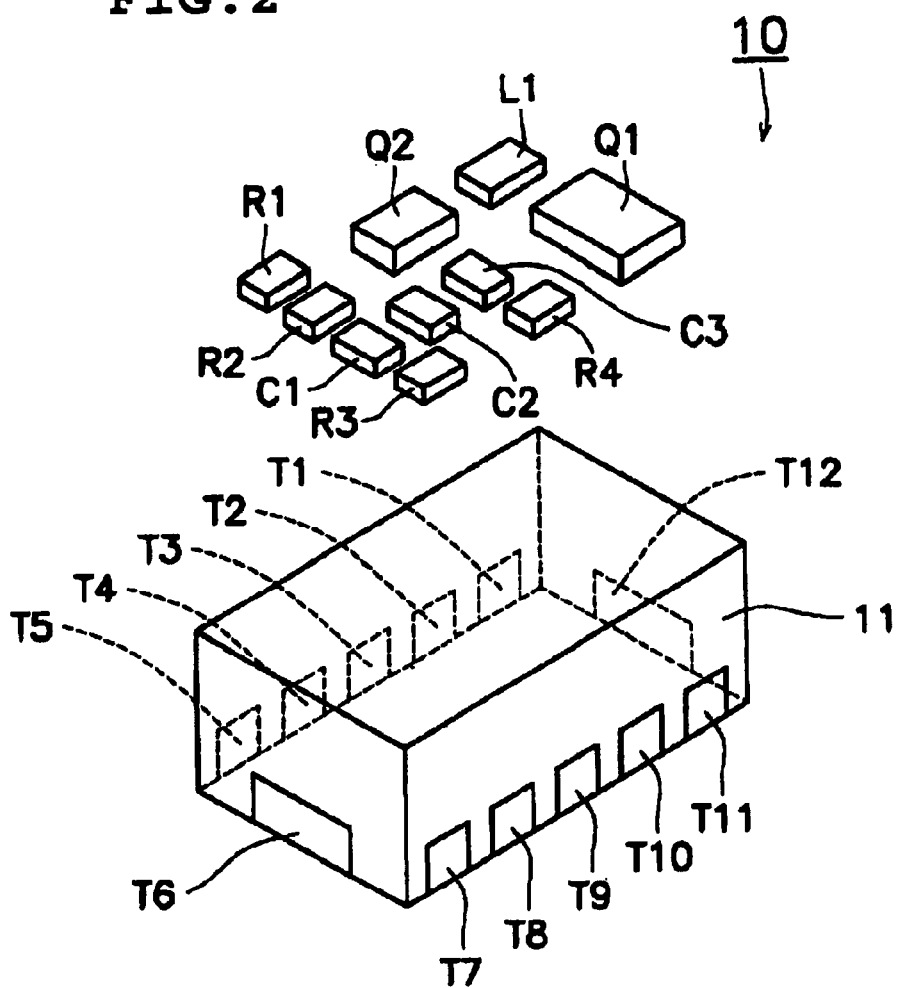
FIG. 2 is a perspective view of the high-frequency composite component in accordance with the first embodiment.
Figure 3A:
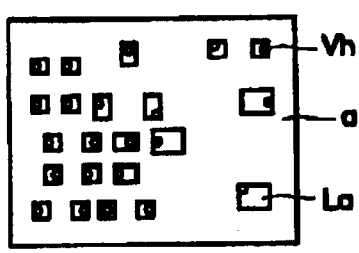
FIGS. 3A to 3F respectively show top views of first through sixth dielectric layers forming the multi-layer substrate of the high-frequency composite component shown in FIG. 1.
Figure 3B:
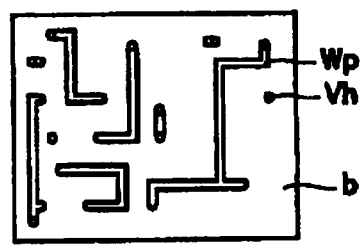
Figure 3C:
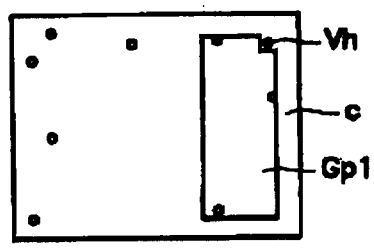
Figure 3D:
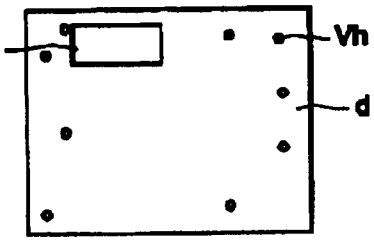
Figure 3E:
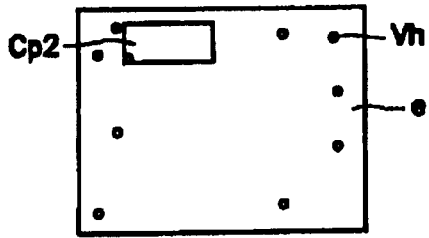
Figure 3F:
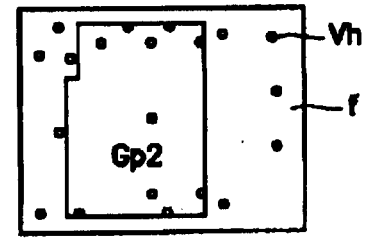
Figure 4A:
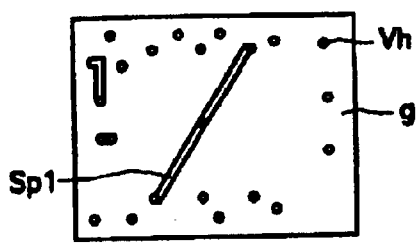
FIGS. 4A to 4E respectively show top views of seventh through eleventh dielectric layers constituting the multi-layer substrate of the high-frequency composite component shown in FIG. 1.
Figure 4B:
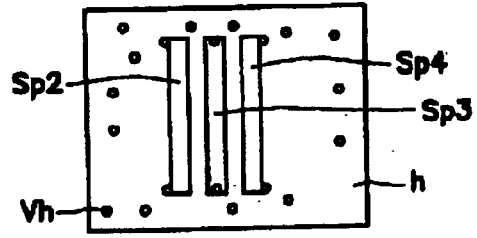
Figure 4C:
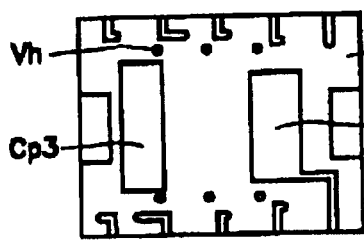
Figure 4D:
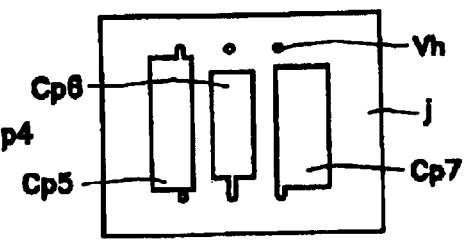
Figure 4E:
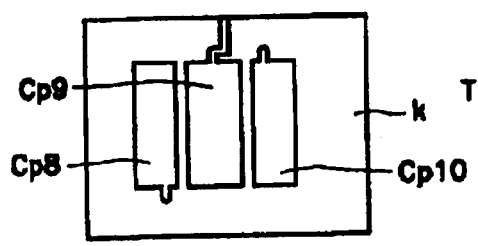
Figure 4F:
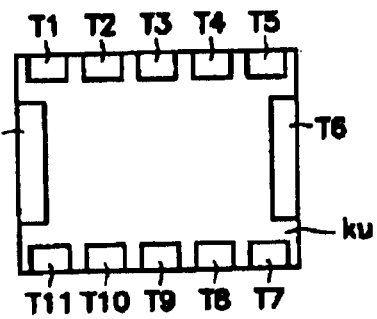
FIG. 4F shows a bottom view of the eleventh dielectric layer.

FIG. 2 is a perspective view of the high-frequency composite component shown in FIG. 1. A high-frequency composite component 10 has a multi-layer substrate 11 containing strip-line electrodes and capacitor electrodes (not shown in FIG. 2) forming the strip lines ST1 to ST3, the inductor L2, and the capacitors C4 to C8, which constitute the band pass filter BPF.

On the top surface of the multi-layer substrate 11 are mounted the transistors Q1 and Q2, the inductor L1, the capacitors C1 to C3, and the resistors R1 to R4, which constitute the low noise amplifier LNA. In addition, external terminals T1 to T12 are disposed on the sides of the multi-layer substrate 11 and extending onto the bottom surface thereof.

The external terminals T1 and T11 are used as the input terminal IN and the output terminal OUT of the high-frequency composite component 10, and the external terminals T5 and T7 are used as the control terminals Vcc1 and Vcc2 thereof. The external terminals T2, T10, and T12 are used as ground terminals for the low noise amplifier LNA, and the external terminals T3, T4, T6, T8, and T9 are used as ground terminals for the band pass filter BPF.

FIGS. 3A to 3F and FIGS. 4A to 4F show top views of dielectric layers forming the multi-layer substrate used in the high-frequency composite component shown in FIG. 2, and a bottom view of one of the layers. For example, the multi-layer substrate 11 is made by sequentially laminating the first to the eleventh dielectric layers a to k, which are formed of a low-temperature fired ceramic material whose main components are barium oxide, aluminum oxide, and silica, which can be fired at temperatures ranging between 850° C. and 1000° C.

On the upper surface of the first dielectric layer a are formed a plurality of lands La for mounting the transistors Q1 and Q2, the inductor L1, the capacitors C1 to C3, and the resistors R1 to R4 constituting the low noise amplifier LNA. In addition, on the upper surface of the second dielectric layer b is formed a wiring pattern Wp.

On the upper surface of the third dielectric layer c is formed a ground electrode Gp1, which is the ground of the low noise amplifier LNA, and on the upper surface of the sixth dielectric layer f is formed a ground electrode Gp2, which is the ground of the band pass filter BPF. In addition, on the upper surfaces of the fourth and the fifth dielectric layers d and e, and on the upper surfaces of the ninth to the eleventh dielectric layers i to k, capacitor electrodes Cp1 to Cp10 are formed.

On the upper surfaces of the seventh and the eighth dielectric layers g and h are formed strip-line electrodes Sp1 to Sp4, respectively. On the lower surface of the eleventh dielectric layer k, the external terminals T1 to T12 are formed. The lower surface thereof is indicated by reference numeral ku in FIG. 4F. In addition, on the first to the tenth dielectric layers a to j are formed via-hole electrodes Vh passing through the dielectric layers a to j.

In this case, the capacitors C4 to C8 of the band pass filter BPF are constituted of the pair of capacitor electrodes Cp3 and Cp5, the pair of capacitor electrodes Cp4 and Cp7, the pair of capacitor electrodes Cp5 and Cp8, the pair of capacitor electrodes Cp7 and Cp10, and the pair of capacitor electrodes Cp6 and Cp9, respectively. Additionally, the matching capacitor C9 is constituted of the capacitor electrode Cp1 and the capacitor electrode Cp2.

The inductor L2 of the band pass filter BPF is constituted of the strip-line electrode Sp1, and the strip lines ST1 to ST3 of the band pass filter BPF are constituted of the strip-line electrodes Sp2 to Sp4, respectively.

In addition, the transistors Q1 and Q2, the inductor L1, the capacitors C1 to C3, and the resistors R1 to R4 constituting the low noise amplifier LNA, the strip lines ST1 to ST3, the inductor L2, and the capacitors C4 to C8, which constitute the band pass filter BPF, and the matching capacitor C9 are connected with each other via the wiring pattern Wp and the via hole electrodes Vh inside the multi-layer substrate 11.

The multi-layer substrate 11 having the above-described structure is thereby formed so as to contain the strip lines ST1 to ST3, the inductor L2, and the capacitors C4 to C8 constituting the band pass filter BPF, and the matching capacitor C9 of the high-frequency composite component shown in FIG. 2.

On the upper surface of the multi-layer substrate 11 are mounted the transistors Q1 and Q2, the inductor L1, the capacitors C1 to C3, and the resistors R1 to R4, which constitute the low noise amplifier LNA by using the lands La to form the high-frequency composite component 10.

In the high-frequency composite component of the first embodiment described above, since the ground of the low noise amplifier and the ground of the band pass filter are separately disposed on different layers and are connected to separate ground terminals formed on the multi-layer substrate, the potential of the low noise amplifier ground and the potential of the bandpass filter ground are different.

Accordingly, oscillation occurring due to feedback from the bandpass filter to the low noise amplifier can be suppressed.

Since the low noise amplifier is disposed at the upper part of the multi-layer substrate, and the bandpass filter is disposed at the lower part thereof, the area for mounting the high-frequency composite component can be reduced without deteriorating the characteristics of the low noise amplifier and the bandpass filter.

Furthermore, the transistors, the inductor, the capacitors, and the resistors constituting the low noise amplifier are mounted on the multi-layer substrate made by laminating the plurality of dielectric layers, while the strip lines, the inductor, and the capacitors are contained within the multi-layer substrate to provide the strip-line electrodes and the capacitor electrodes, so as to integrate the amplifier and the filter with the multi-layer substrate. As a result, when compared with conventional components in which a low noise amplifier and a band pass filter constituted of discrete components are mounted and connected with each other on a printed wiring substrate, the area for mounting the low noise amplifier and the band pass filter integrated with the printed wiring substrate can be reduced, so that reduction in size and weight can be achieved. In addition, manufacturing cost can also be reduced.

Furthermore, the low noise amplifier and the band pass filter can be simultaneously designed, whereby the impedance of the low noise amplifier and the band pass filter can be matched. Thus, the installation of a matching circuit is not necessary and reduction in size and weight can thereby be achieved.

Furthermore, since the low noise amplifier and the band pass filter are integrated with the multi-layer substrate, the length of a path connecting the low noise amplifier and the band pass filter can be shortened so as to reduce losses due to the connecting path and power consumption. Thus, losses of the high-frequency composite component can also be reduced.

In addition, since a low-temperature fired ceramic substrate is used as the multi-layer substrate, the plurality of dielectric layers and the electrodes forming the strip lines and the capacitors disposed on the dielectric layers can be integrally fired. As a result, manufacturing process can be shortened to achieve cost reduction.

Figure 5:
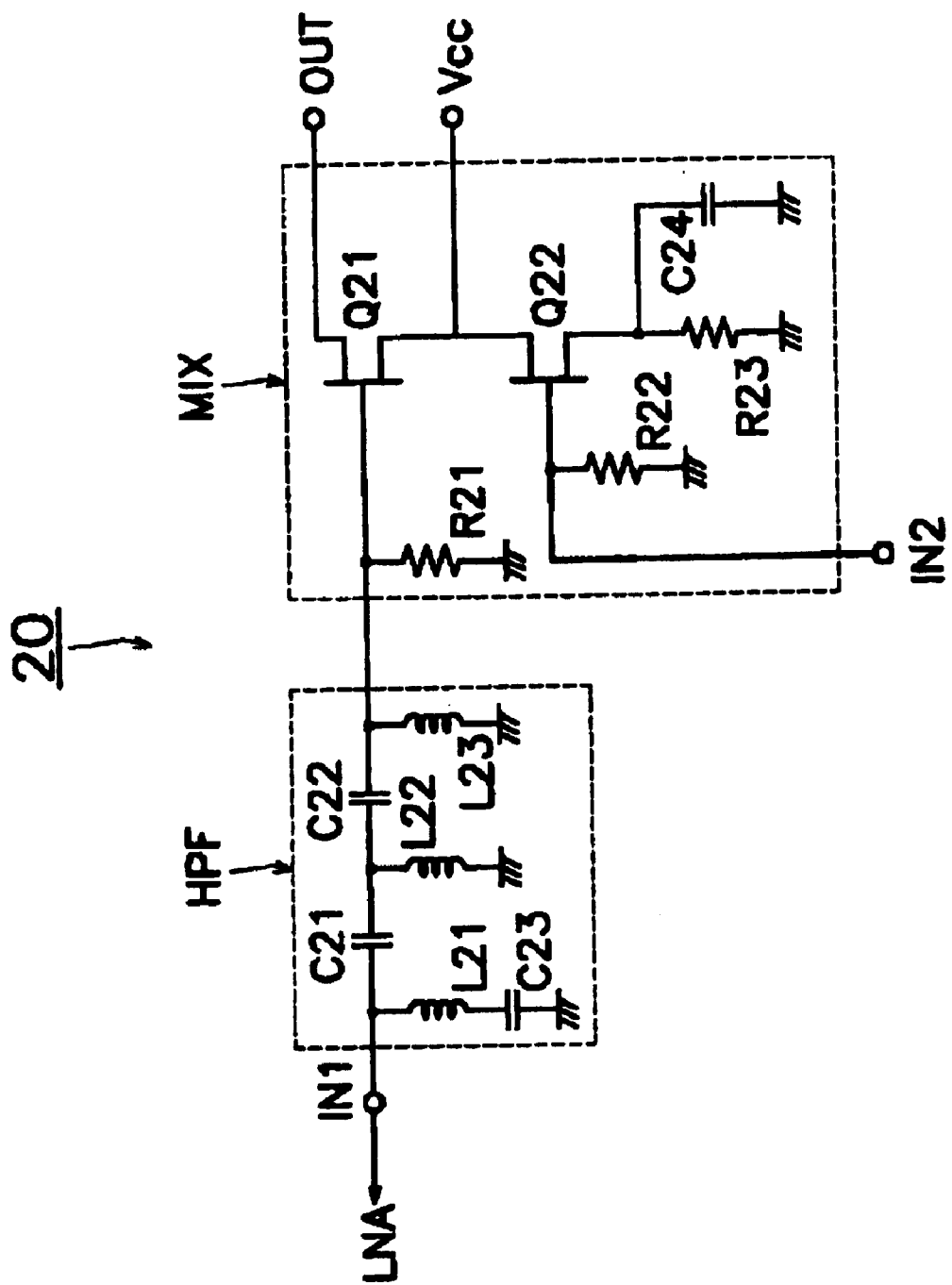
FIG. 5 is an equivalent circuit diagram of a high-frequency composite component in accordance with a second embodiment of the present invention.

FIG. 5 shows an equivalent circuit diagram of a high-frequency composite component of a second embodiment in accordance with the present invention. The high-frequency composite component 20 is constituted of a high-frequency mixer MIX forming a part of the high-frequency circuit of a cellular phone or a pager adapted for the PHS system or the PDC system, and a high-pass filter HPF as a filter in the cellular phone or pager, with input terminals IN1 and IN2, an output terminal OUT, and a control terminal Vcc.

The high-pass filter HPF, which is constituted of inductors L21 to L23 and capacitors C21 to C23, is used for eliminating unnecessary signals included in signals received by an antenna ANT and input from the input terminal IN1.

The high-frequency mixer MIX is constituted of transistors Q21 and Q22, a capacitor C24, and resistors R21 to R23, in which received signals passing through the high-pass filter HPF and local oscillation signals input from the input terminal IN2 are mixed to output intermediate frequency signals.

FIG. 6 is a perspective view of the high-frequency composite component shown in FIG. 5. The high-frequency composite component 20 has a multi-layer substrate 21, in which strip-line electrodes and capacitor electrodes (not shown in FIG. 6) forming the inductors L21 to L23 and the capacitors C21 to C23 constituting the high-pass filter HPF are built.

On the upper surface of the multi-layer substrate 21 is mounted the high-frequency mixer MIX which is formed in this example of an MMIC. In addition, the external terminals T21 to T28 are disposed on the sides of the multi-layer substrate 21 and extending onto the bottom surface thereof.

The external terminals T21 and T23 are the input terminals IN1 and IN2 of the high-frequency composite component 20, and the external terminal T27 is the output terminal OUT thereof. The external terminal T25 is the control terminal Vcc of the high-frequency composite component 20, the external terminals T22 and T26 are ground terminals connected to the ground of the high-frequency mixer MIX, and the external terminals T24 and T28 are ground terminals connected to the ground of the high-pass filter HPF.

FIGS. 7A to 7H show the upper surface views and one lower surface view of dielectric layers forming the multi-layer substrate of the high-frequency composite component shown in FIG. 6. For example, the multi-layer substrate 21 is made by sequentially laminating the first to the eleventh dielectric layers a2 to g2, which are formed of a low-temperature fired ceramic material whose main components are barium oxide, aluminum oxide, and silica which can be fired at temperatures between 850° C. and 1000° C.

On the upper surface of the first dielectric layer a2 is formed a plurality of lands La2 for mounting the high-frequency mixer MIX formed of an MMIC. In addition, on the upper surface of the second dielectric layer b2 is formed a ground electrode Gp21 as the ground of the high-frequency mixer MIX, and on the upper surface of the fourth dielectric layer d2 is formed a ground electrode Gp22 as the ground of the high-pass filter HPF.

Furthermore, on the upper surface of the third, the sixth, and the seventh dielectric layers c2, f2, and g2 are formed capacitor electrodes Cp21 to Cp25, respectively. On the upper surface of the fifth dielectric layer e2 are formed strip-line electrodes Sp21 to Sp23, respectively.

Figure 7A:
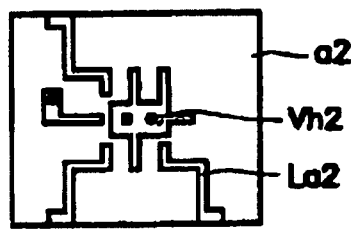
FIGS. 7A to 7G respectively show top views of a first dielectric layer to a seventh dielectric layer forming the multi-layer substrate of the high-frequency composite component shown in FIG. 5.
Figure 7B:
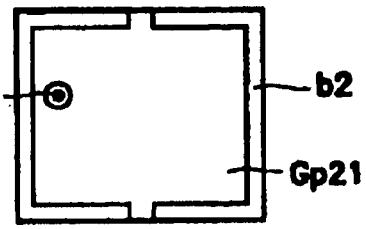
Figure 7C:
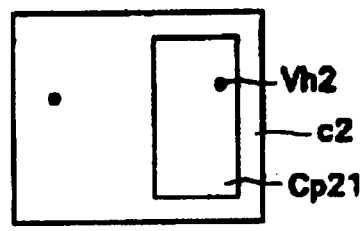
Figure 7D:
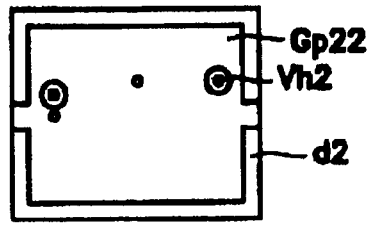
Figure 7E:
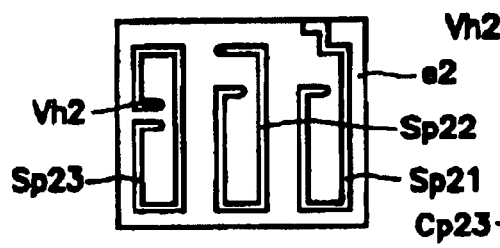
Figure 7F:
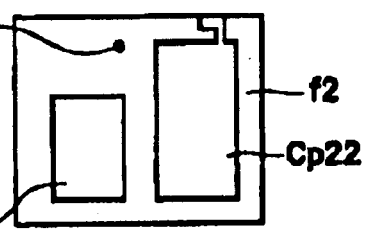
Figure 7G:
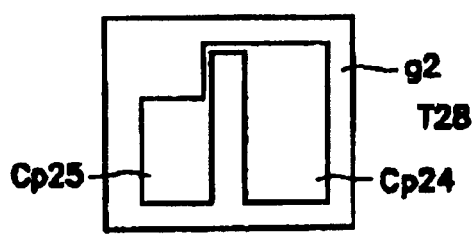
Figure 7H:
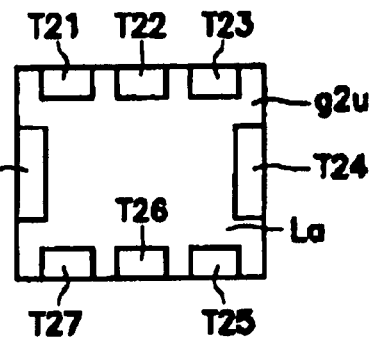
FIG. 7H shows a bottom view of the seventh dielectric layer.

Additionally, on the lower surface of the seventh dielectric layer g2, the lower surface being indicated by reference numeral g2u shown in FIG. 7H, the external terminals T21 to T28 are formed. In each of the first to the sixth dielectric layers a2 to f2, via-hole electrodes Vh2 are formed in such a manner that they pass through the dielectric layers a2 to f2.

In this case, the capacitors C21 to C23 of the high-pass filter HPF are constituted of the pair of a capacitor electrodes Cp22 and Cp24, the pair of capacitor electrodes Cp23 and Cp25, and the capacitor electrode Cp21 and the ground electrode Gp2, respectively. In addition, the inductors L21 to L23 of the high-pass filter HPF are constituted of the strip-line electrodes Sp21 to Sp23, respectively.

Furthermore, the high-frequency mixer MIX formed of an MMIC, and the inductors L21 to L23 and the capacitors C21 to C23 forming the high-pass filter HPF are connected by the via holes Vh2 inside the multi-layer substrate 21.

Consequently, the multi-layer substrate 21 having the above-described structure is formed containing the inductors L21 to L23, and the capacitors C21 to C23 forming the high-pass filter HPF of the high-frequency composite component 20 shown in FIG. 6.

Additionally, the high-frequency mixer MIX formed of an MMIC is mounted on the upper surface of the multi-layer substrate 21 by using the lands La2 to form the high-frequency composite component 20.

According to the high-frequency composite component of the second embodiment described above, the high-frequency mixer ground and the high-pass filter ground are separate and are connected to separate ground terminals formed on the multi-layer substrate. As a result, leakage of high-frequency signals between the high-frequency mixer and the high-pass filter can be suppressed. Therefore, isolation can be provided between the high-frequency mixer and the high-pass filter.

Moreover, the high-frequency mixer formed of an MMIC is mounted on the multi-layer substrate made by laminating the plurality of dielectric layers, and the inductor and the capacitors constituting the high-pass filter are built in the multi-layer substrate as a strip-line electrode and capacitor electrodes to be integrated with the substrate. With this arrangement, the high-frequency composite component of the second embodiment is different from a conventional one in which a high-frequency mixer and a high-pass filter constituted of discrete components are mounted and connected on a printed wiring substrate, in that the area for mounting the high-frequency mixer and the high-pass filter in the printed wiring substrate can be reduced so as to achieve reduction in size and weight of the high-frequency composite component. In addition, a decrease in production cost thereof can also be achieved.

Furthermore, both the high-frequency mixer and the high-pass filter can be simultaneously designed, whereby the impedance of the high-frequency mixer and the high-pass filter can be matched. As a result, the installation of a matching circuit is unnecessary, whereby a further reduction in size and weight of the high-frequency composite component can be achieved.

Furthermore, since the high-frequency mixer and the high-pass filter are integrated with the multi-layer substrate, the length of the path connecting the high-frequency mixer and the high-pass filter can be made shorter, so that losses due to the connecting path and power consumption can be reduced. Thus, the losses of the high-frequency composite component can also be reduced.

In addition, since a low-temperature fired ceramic substrate is used as the multi-layer substrate, the plurality of dielectric layers and the electrodes forming the strip lines and the capacitors thereon can be integrally fired. Thus, the manufacturing process can be shortened and cost reduction can thereby be achieved.

Figure 8:
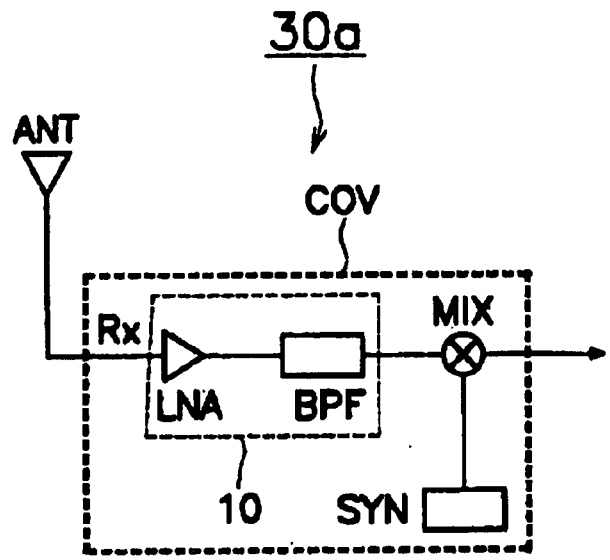
FIG. 8 is an RF block diagram of a pager, which is an example of a typical portable wireless device.

FIG. 8 is an RF block diagram of a pager which is an example of a typical portable wireless device. A pager 30a includes an antenna ANT, a reception circuit Rx connected to the antenna ANT, and a case COV for covering the reception circuit Rx.

The reception circuit Rx is constituted of a low noise amplifier LNA, a band pass filter BPF, and a mixer MIX. An input of the mixer MIX of the reception circuit RX is connected to a synthesizer SYN for generating a local signal.

In this example, the high-frequency composite component 10 shown in FIG. 2 is used for the low noise amplifier LNA and the band pass filter BPF of the reception circuit Rx as the high-frequency circuit unit of the pager 30a.

Figure 9:
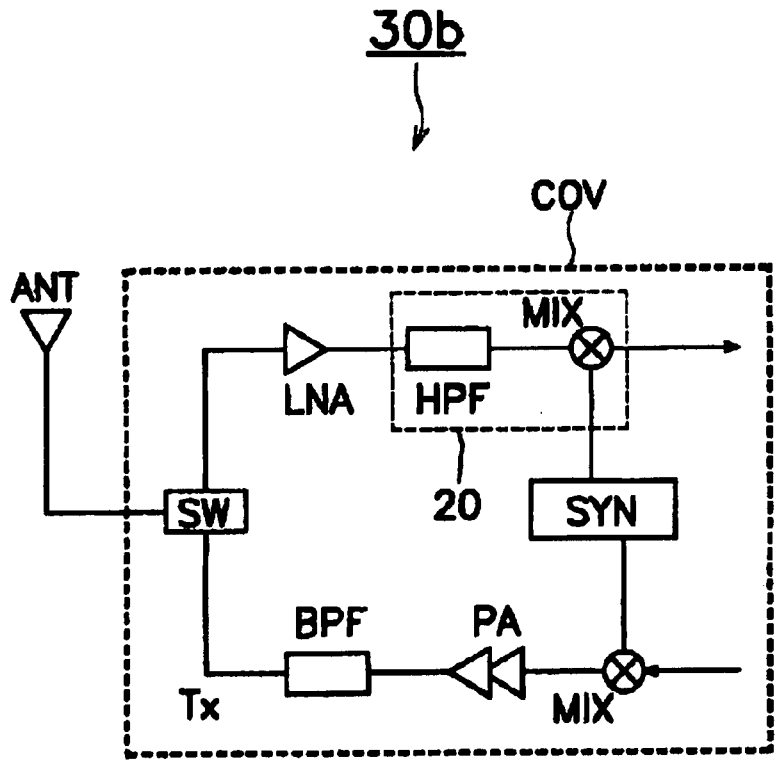
FIG. 9 is an RF block diagram of a cellular phone, which is another example of a typical portable wireless device.

FIG. 9 is an RF block diagram of a cellular phone which is a typical portable wireless device. A cellular phone 30b includes an antenna ANT, a switch SW, a reception circuit Rx and a transmission circuit Tx connected to the antenna ANT via the switch SW, and a case COV for covering the reception circuit Rx and a transmission circuit Tx.

The reception circuit Rx includes a low noise amplifier LNA, a high-pass filter HPF, and a mixer MIX, and the transmission circuit Tx includes a high-power amplifier PA, a band pass filter BPF, and a mixer MIX. Additionally, an input of the mixer MIX of the reception circuit Rx and an input of the mixer MIX of the transmission circuit Tx are connected to a synthesizer SYN for generating a local signal.

In this example, the high-frequency composite component 20 shown in FIG. 6 is used for the mixer MIX and the high-pass filter HPF of the reception circuit Rx as the high-frequency circuit of the cellular phone 30b.

According to the portable wireless devices of the above-described embodiments, since the high-frequency composite components are capable of suppressing oscillation or providing isolation because of the above-described separation of their various parts, degradation in the characteristics of the high-frequency composite component can be prevented.

Furthermore, since the compact high-frequency composite component is used for the reception circuit of the portable wireless device, the size of the portable wireless device can be reduced.

The above embodiments use a low noise amplifier as the amplifier constituting a high-frequency circuit, a single high-frequency mixer as the mixer, and a band pass filter and a high-pass filter as the filters as the examples for illustration. However, other alternatives can be considered in order to obtain the same advantages. For example, a high-power amplifier as the amplifier, a double-balanced mixer as the mixer, and a low-pass filter and a band block filter as the filters can be used.

Figure 10:
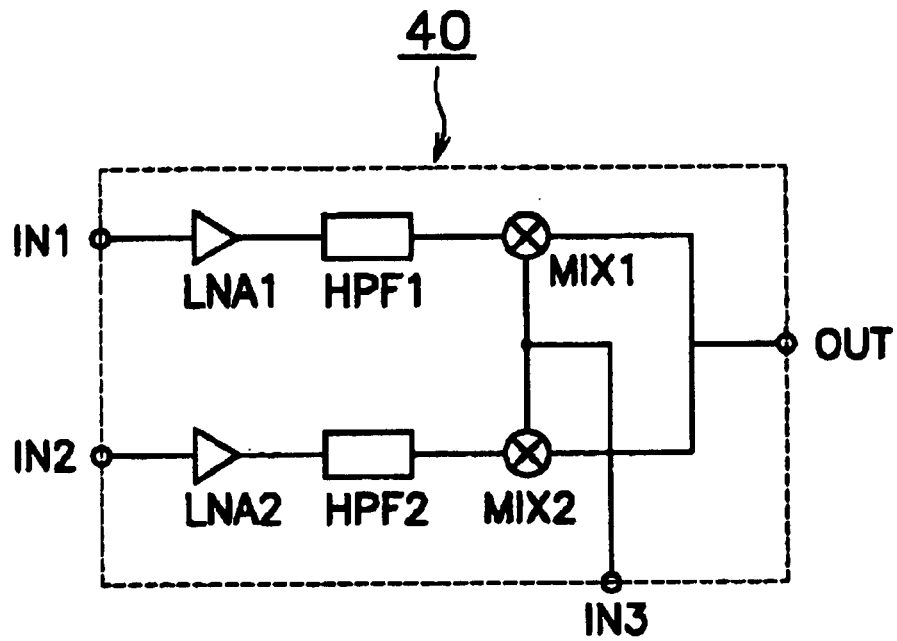
FIG. 10 is a block diagram of a high-frequency composite component in accordance with a third embodiment of the present invention.
Figure 11:
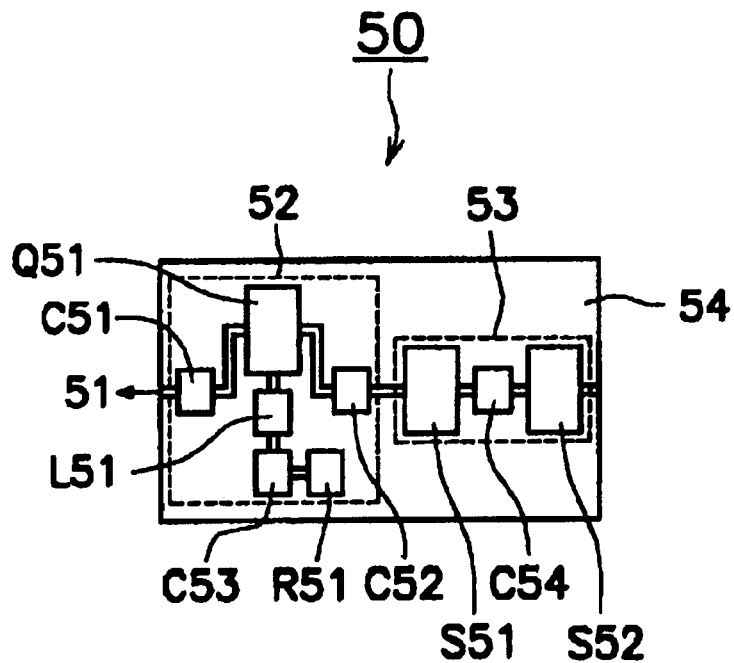
FIG. 11 is a top view of a conventional high-frequency composite component.

In addition, although a description has been given of the case where a single amplifier, a single mixer, and a single filter are used in the embodiments, it is also possible to use a high-frequency composite component 40 including a plurality of amplifiers, a plurality of mixers, and a plurality of filters as shown in FIG. 10. In FIG. 10, reference numerals LNA1 and LNA2 denote amplifiers, reference numerals MIX1 and MIX2 denote mixers, and reference numerals HPF1 and HPF2 denote filters. In this case, the grounds of these units may be the same or different. However, when the grounds of these units are separate and are connected to separate external terminals formed on the multi-layer substrate, greater advantages can be obtained.

In the above embodiments, the amplifier is constituted of discrete components, whereas the mixer is constituted of an MMIC. However, the amplifier can also be constituted of an MMIC, whereas the mixer can be constituted of discrete components to be mounted on the multi-layer substrate.

In addition, the active components and the passive components constituting the amplifier and the mixer are mounted on the multi-layer substrate in the above embodiments. Alternatively, they can be placed inside a cavity formed in an outer surface of the multi-layer substrate. In this case, since the amplifier and the mixer do not protrude past the outer surface of the multi-layer substrate, there is less possibility that those units will come off the multi-layer substrate, with the result that reliability of the high-frequency composite component can be increased. Particularly, when the cavity formed in the multi-layer substrate is sealed by a cap formed of a metal material or a ceramic material, it is possible to mount another electronic component on the cap. As a result, the size of the high-frequency composite component can be made smaller.

Furthermore, in the above-described embodiments, pairs of circuits, including the amplifier and the filter, and the mixer and the filter, are integrated with the multi-layer substrate. However, alternatively, a single amplifier, a single mixer, and a single filter can be integrated with the multi-layer substrate. This can contribute to further reduction in size of the high-frequency composite component.

In addition, the multi-layer substrate is formed of a material whose main components are barium oxide, aluminum oxide, and silica. However, other materials can also be considered. For example, a material whose main components are barium oxide, silica, strontium oxide, and zirconium oxide, or another one whose main components are calcium oxide, zirconium oxide, and glass, etc., can be applied.

As described above, according to the first aspect of the present invention, in the high-frequency composite component, the amplifier ground and the filter ground are separated and are connected to separate external terminals formed on the multi-layer substrate, so that the potential of the amplifier ground and the potential of the filter ground are different. Accordingly, oscillation generated by the feedback from the filter to the amplifier can be suppressed.

In addition, since the amplifier and the filter are integrated with the multi-layer substrate, the length of the path for connecting the low noise amplifier and the band pass filter can be shortened, with the result that losses due to the connecting path and power consumption can be reduced. Also, losses of the high-frequency composite component can be reduced.

Additionally, both the high-frequency mixer and the high-pass filter can be simultaneously designed, whereby the impedance between the high-frequency mixer and the high-pass filter can be matched. As a result, the installation of a matching circuit is unnecessary, so that reduction in size and weight of the high-frequency composite component can be achieved.

In the high-frequency composite component in accordance with the second aspect of the present invention, since the amplifier is disposed at the upper part of the multi-layer substrate, and the filter is disposed at the lower part thereof, the area required for mounting the high-frequency composite component can be reduced without deteriorating the characteristics of the amplifier and the filter.

In this high-frequency composite component, an active element and a passive element constituting the amplifier are mounted on the multi-layer substrate, which is made by laminating a plurality of dielectric layers, and a passive element constituting the filter such as a strip-line electrode or a capacitor electrode is built in the multi-layer substrate to be integrated with the multi-layer substrate. As a result, as compared with a conventional component in which an amplifier and a filter constituted of discrete components are mounted and connected, on a printed wiring substrate, the area for mounting the amplifier and the filter in the printed wiring substrate can be reduced, so that reduction in size and weight can be achieved. In addition, reduction in manufacturing cost can also be achieved.

According to the second aspect of the present invention, in the high-frequency composite component, the ground on the mixer and the ground on the filter are separated and are connected to separate ground terminals formed on the multi-layer substrate. As a result, leakage of high-frequency signals occurring between the mixer and the filter can be suppressed. Therefore, isolation can be provided between the mixer and the filter.

Furthermore, since the mixer and the filter are integrated with the multi-layer substrate, the length of the path for connecting the mixer and the filter can be shortened, so that losses due to the connecting path and power consumption can be reduced. Thus, losses of the high-frequency composite component can also be reduced.

In addition, the mixer and the filter can be simultaneously designed, so that the impedance between the mixer and the filter can be matched. As a result, since the installation of a matching circuit is unnecessary, reduction in size and weight can be achieved.

In this high-frequency composite component, an active element and a passive element constituting the amplifier are mounted on the multi-layer substrate made by laminating a plurality of dielectric layers, and a passive element constituting the filter such as a strip-line electrode or a capacitor electrode is built integrally into the multi-layer substrate. As a result, when compared with a conventional component in which an amplifier and a filter constituted of discrete components are mounted on a printed wiring substrate and connected, the area for mounting the amplifier and the filter in the printed wiring substrate can be reduced, so that reduction in size and weight can be achieved. In addition, reduction in manufacturing cost can also be achieved.

According to another aspect of the present invention, in the portable wireless device of the invention, since a high-frequency composite component capable of suppressing oscillation or a high-frequency composite component capable of providing isolation is used, deterioration in the characteristics of the portable wireless device can be prevented.

In addition, since a compact high-frequency composite component is used in the high-frequency circuit unit of the portable wireless device, the portable wireless device can be made smaller.

While the invention has been particularly shown and described with reference to preferred embodiments thereof, it will be understood by those skilled in the art that the foregoing and other changes in form and details may be made therein without departing from the spirit of the invention.

What is claimed is:

1. A high-frequency composite component comprising:
   a high-frequency circuit including an amplifier and a filter;
   a multi-layer substrate made by laminating a plurality of dielectric layers, the amplifier and the filter being integrated and interconnected by the multi-layer substrate;
   an amplifier ground;
   a filter ground;
   external terminals formed on the multi-layer substrate; and
   wherein the amplifier ground and the filter ground are disposed separate from each other within the multi-layer substrate, and are disposed such that the amplifier ground and the filter ground are not aligned in the lamination direction, and are connected respectively to separate ones of said external terminals formed on the multi-layer substrate.

2. A high-frequency composite component according to claim 1, wherein the amplifier is disposed at an upper part of the multi-layer substrate and the filter is disposed at a lower part thereof.

3. A high-frequency composite component according to claim 2, wherein elements constituting the amplifier are mounted externally on the multi-layer substrate as chip components, and elements constituting the filter are formed by electrodes within the multi-layer substrate.

4. A high frequency composite component comprising:
   a high-frequency circuit including a mixer and a filter, the filter comprising a grounded capacitor, a non-grounded capacitor, and an inductor, the grounded capacitor comprising a first capacitor electrode, and the non-grounded capacitor comprising a second capacitor electrode;

a multi-layer substrate made by laminating a plurality of dielectric layers, the mixer and the filter being integrated and interconnected by the multi-layer substrate;

a mixer ground disposed on one of the plurality of the dielectric layers;

a filter ground disposed on another of the plurality of the dielectric layers; and external terminals formed on the multi-layer substrate; wherein the mixer ground and the filter ground are disposed separate from each other within the multi-layer substrate and are connected respectively to separate ones of said external terminals formed on the multi-layer substrates;

the first capacitor electrode of the grounded capacitor is provided between the mixer ground and the filter ground;

the capacitance of the grounded capacitor of the filter is provided between the first capacitor electrode and the filter ground; and the filter around is provided between the first capacitor electrode of the grounded capacitor and the second capacitor electrode of the non-grounded capacitor.

5. A high-frequency composite component according to claim 4, wherein elements constituting the mixer are mounted externally on the multi-layer substrate, and elements constituting the filter are formed by electrodes within the multi-layer substrate.

6. A portable wireless device comprising at least one of a transmitting circuit and a receiving circuit, and connected therein, a high-frequency composite component in accordance with one of claims 1 to 5.

7. A high-frequency composite component according to claim 4, wherein the inductor of the filter is provided between the filter ground and the second capacitor electrode of the non-grounded capacitor.

* * * * *